United States Patent [19]
Jenkins

[11] Patent Number: 6,029,169
[45] Date of Patent: Feb. 22, 2000

[54] UNIVERSAL SOFTWARE STRUCTURE FOR REPRESENTING MODEL STRUCTURES

[75] Inventor: Jimmy J. Jenkins, Montara, Calif.

[73] Assignee: Stratum Technologies Corporation, Montara, Calif.

[21] Appl. No.: 08/845,984

[22] Filed: May 1, 1997

[51] Int. Cl.[7] .................................................. G06F 17/30
[52] U.S. Cl. ........................ 707/100; 707/101; 707/204
[58] Field of Search .................................... 395/706, 712, 395/703; 707/1, 100, 101, 204

[56] References Cited

U.S. PATENT DOCUMENTS

| | | | |
|---|---|---|---|
| 4,514,800 | 4/1985 | Gruner et al. | 364/200 |
| 4,558,413 | 12/1985 | Schmidt | 707/712 |
| 4,809,170 | 2/1989 | Leblang et al. | 395/706 |
| 4,951,192 | 8/1990 | Chase, Jr. et al. | 395/706 |
| 5,047,925 | 9/1991 | Kun et al. | 364/200 |
| 5,193,183 | 3/1993 | Buchman | 395/600 |
| 5,247,666 | 9/1993 | Buckwold | 395/600 |
| 5,303,367 | 4/1994 | Leenstra, Sr. et al. | 395/600 |
| 5,325,543 | 6/1994 | Galy et al. | 395/712 |
| 5,333,317 | 7/1994 | Dann | 707/101 |
| 5,335,323 | 8/1994 | Kolnink | 395/164 |
| 5,390,330 | 2/1995 | Talati | 395/712 |
| 5,421,017 | 5/1995 | Scholz et al. | 707/712 |
| 5,502,839 | 3/1996 | Kolnick | 395/800 |
| 5,577,252 | 11/1996 | Nelson et al. | 395/670 |
| 5,587,935 | 12/1996 | Brooks et al. | 364/578 |
| 5,640,567 | 6/1997 | Phipps | 395/703 |
| 5,682,468 | 10/1997 | Fortenbery et al. | 395/119 |
| 5,689,711 | 11/1997 | Bardasz et al. | 395/701 |
| 5,706,501 | 1/1998 | Horikiri et al. | 707/10 |
| 5,724,589 | 3/1998 | Wold | 395/701 |
| 5,745,683 | 4/1998 | Lee et al. | 395/200.8 |
| 5,764,984 | 6/1998 | Loucks | 395/682 |
| 5,812,850 | 9/1998 | Wimble | 395/704 |
| 5,842,223 | 11/1998 | Bristor | 707/204 |
| 5,878,406 | 3/1999 | Noyes | 706/55 |

*Primary Examiner*—Thomas G. Black
*Assistant Examiner*—Frantz Coby
*Attorney, Agent, or Firm*—Flehr Hohbach Test Albritton & Herbert LLP

[57] ABSTRACT

An embodiment of a computer for storing, manipulating and retrieving data structures includes a memory configured to store a plurality of data in a plurality of data structure types including a first data structure type, a second data structure type and a relationship data structure type. An interface is configured to receive instructions and calls from an external structure and to respond to the instructions and the calls. A processor is coupled to the memory and the interface circuit and configured to receive the instructions and to associate information in the instructions with the first data structure type, the second data structure type and the relationship data structure type, the instruction including information to store in the relationship data structure type that relates one or more of the first data structure type and the second data structure type. The processor is also configured to receive the calls and to manipulate the first data structure type, the second data structure type and the relationship data structure type according to the call, to retrieve a data structure type based on the call and to provide information in the first data structure type as a call response. Advantages of the invention include the ability to characterize information and data structure types in a minimal set of primitives in order to model more complex systems.

21 Claims, 7 Drawing Sheets

UNIVERSAL SOFTWARE STRUCTURE FOR REPRESENTING MODEL STRUCTURES

FIELD

The invention relates to a universal software structure for representing model structures. The invention is used to define a computer software "Meta-Model" that is used to create other software models. The invention has the capabilities of capturing and embodying structures, activities, triggers/controls and contexts.

BACKGROUND

Models are often used to characterize various static and dynamic structures and systems in order to predict behavior. In this specification, the word system is used to refer to static and dynamic models. One reason for models is to reduce cost and improve predictability of systems so that a system will operate as designed. For example, models of automobile traffic are made before the roads are built in order to determine whether the planned roads are sufficient for the expected amount of traffic. Moreover, the models are helpful for determining what happens to the system, for example, when an accident causes congestion on one of the roads or when traffic patterns change.

The computer software industry has created a myriad of specialized programs intended to be "turn-key" solutions for specific tasks. Many of these programs are very useful for the specific jobs they were intended to address. These software programs effectively address the single need of each job, but are incapable of application to address multiple needs within the same organization across multiple industries/markets. Accordingly, the limitation of existing models is the inability to apply structure and information for a variety of different applications.

What is needed is a universal software structure for representing model structures, or "Meta-Model," which is implemented as a single system with numerous processes that provide the ability to represent several different models simultaneously. This would allow a single implementation layer to represent several different specialized models to address the individual needs of applications within the same organization or software system. By addressing the specialized needs across several software models at the same time, a Meta-Model can reduce the effort required to create specialized models.

SUMMARY

The invention represents a universal set of computer software model structures, or "Meta-Model," having the ability to represent a multitude of software models. The invention provides a set of primitives that represents fundamental elements of software models. The primitives are used to create virtual models to manage and control sequences of activities, information content and information relationships, and decision points within processes. The primitives can further define models from a particular point of view or perspective.

The foundation of the Meta-Model is based on a set of primitives that are defined using a symbolic language described below. This symbolic language represents a set of unchanging primitive level of procedures, giving it a "plug in" functionality to adapt to other requirements. Construction of a model is accomplished by defining the structures, activities and processes of the virtual model. These definitions are then implemented and executed by accessing the procedures within the Meta-Model representing the individual definitions and context of perspective used by the virtual model.

A computer according to an embodiment of the invention includes a memory configured to store a plurality of data in a plurality of data structure types including a first data structure type, a second data structure type and a relationship data structure type. An interface is configured to receive instructions and calls from an external structure and to respond to the instructions and the calls. A processor is coupled to the memory and the interface circuit and configured to receive the instructions and to associate information in the instructions with the first data structure type, the second data structure type and the relationship data structure type, the instruction including information to store in the relationship data structure type that relates one or more of the second data structure type(s) and another second data structure type. The processor is also configured to receive the calls and to manipulate the first data structure type, the second data structure type and the relationship data structure type according to the call, to retrieve a data structure type based on the call and to provide information in the first data structure type as a call response.

Advantages of the invention include the ability to characterize information and data structure types in a minimal set of primitives in order to model more complex systems.

BRIEF DESCRIPTION OF THE FIGURES

Additional advantages of the invention will become apparent upon reading the following detailed description and upon reference to the drawings, in which.

DETAILED DESCRIPTION

Figure 1A:
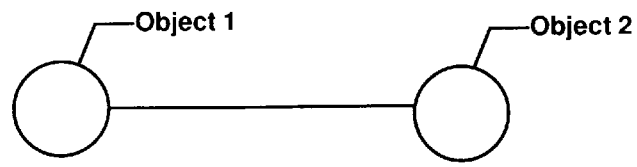
FIGS. 1A–D represent objects that are related to one another as shown.

The exemplary embodiments are described herein with reference to specific configurations. Those skilled in the art will appreciate that various changes and modifications can be made to the exemplary embodiments while remaining within the scope of the invention.

A. Meta-Models

Software construction is extremely labor-intensive and expensive. If changes need to be made during the life cycle of the software, which is normally the case, this increases the overall expense of the project or product. To decrease costs and repetitive efforts, there is clearly a need for the base software to have a substantially fixed structure. A Meta-Model allows a reduction in both the original construction effort and the ongoing maintenance of a system. This is because the same basic structure is used throughout the life cycle of the system. The initial design for the implementation of a Meta Model is greater than for normal software models, but any maintenance and rework efforts are decreased. A Meta-Model must be based on a set of substantially fixed principles that are described within a language that delineates models (i.e. a Meta Language). By using a Meta Language, new concepts, structures and processes can be implemented within a Meta-Model that supports that language.

Identified advantages of using a Meta-Model to create Virtual Models include: enabling the creation of truly customized virtual models; dramatically decreased development time for follow-on projects; dramatically reduced maintenance effort; and since the Meta-Model has the ability to accommodate and adapt to unforeseen requirements of a system it can dynamically adapt its own structures of deployed models and can even dynamically change data within an already deployed Meta-Model. Further, Meta-Models are not required to be implemented within any specific software language. The Meta-Model's fundamental principles are substantially the same across software languages. This allows transporting of the virtual model's logic to another Meta-Model that has been implemented in a different software language.

A Meta-Model is used to create other software models. The exemplary embodiments describe in detail the Meta-Model structure and process of implementing and interacting with the Meta-Model. The preferred embodiments are based on three core data structures and a set of procedures to manipulate these data structures. The data structures are used to contain the low level primitives. The Meta-Model procedures are used to store, update and animate the primitives within the data structures.

For a Meta-Model to function, it must be able to emulate a wide variety of virtual models. Virtual morphing is possible through an implementation layer that has the ability to manage and store a set of unchanging universal primitives that are used to define virtual models. Software models in general, address a major problem domain that commonly contains three sub-domains: Structure, Process (or energy expended), and Trigger/Event.

Virtual models embodied in a Meta-Model should address the same three problem domains. This covers some aspects of a Meta-Model and required functionality virtual models. Some aspects of Meta-Language must also be addressed, such as, for a Meta-Language to function it must address the same problem domains. To further explain the concepts regarding Meta-Models and the Meta-Language examples shown below will be based on a simple train system. In this virtual model, the train will be traveling from New York to Los Angeles through several stations.

B. Software Models Using Meta-Models

Software models contain several structures that are used to address the problem sub-domains. These structures are based on several basic principles. To convey an understanding of a Meta-Model and the concepts required to create the virtual models that are stored within a Meta-Model, we will start with some basic structures that software systems address. Software models are built within code and data structures to address the problem sub-domains. The Meta-Model addresses the same problem domains via implementing the primitives defined within the Meta-Language.

The examples here are based on a very simple train system to describe how a virtual model is stored within a Meta-Model. To begin, several basic structures are shown. In essence, these are very small virtual models. The Meta-Model clearly needs to have the ability to describe these basic virtual models. These examples are overly simplified and are not intended to be a real-world description of an actual train system, but will demonstrate certain aspects of constructing a Meta-Model.

1. Basic Structures

Shown below are examples of basic structures (virtual models) that the Meta-Language needs to describe. Examples based on a train system are shown for each of the basic conceptual models.

(a) One to One

One to one relationships carry information about each object and their relationship to each other. The relationship itself can also be classified as an object that can carry details about the relationship between the objects. This type of object recursion of objects spawning other objects is common within the Meta-Model. The spawned object is treated just as another object within the Meta-Model.

An example of a one to one relationship:

The train system example has several one-to-one relationships of both object to object and object to value. FIG. 1A depicts "Object 1" related to "Object 2". The two objects could be the New York and Philadelphia train stations. The relationship object (Train Network Relationship 1) could have an attached value of 90 miles describing the distance between the two stations. The term "Train Network Relationship 1" is the declaration of the concept of one object related to another object and in itself is also an object. The term is arbitrary and is only used to declare the unique relationship between two objects.

(b) One to Many

Figure 1B:
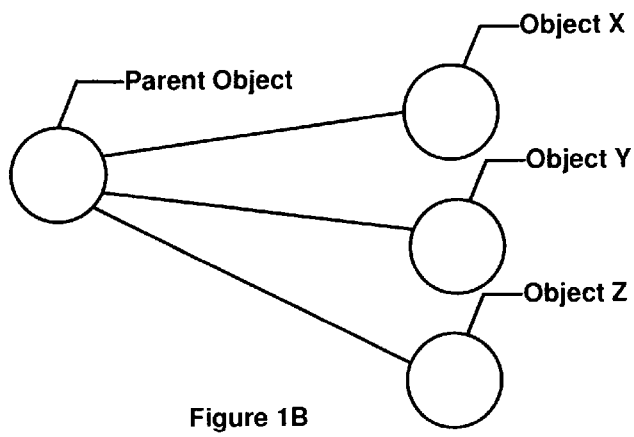

Another basic relationship is from one object to many objects. A relationship of this type is used to relate one object to several other objects for a specific subject, such as that shown in FIG. 1B. The objects that are being related can be of the same basic type or of several different types. Like different children who share the same mother or the parts of an internal combustion engine.

Example—One to Many

An example of this would be one train having a relationship to each of the passengers being transported on that train. The parent object would be the train and the related objects would be each passenger.

(c) Many to Many

Figure 1C:
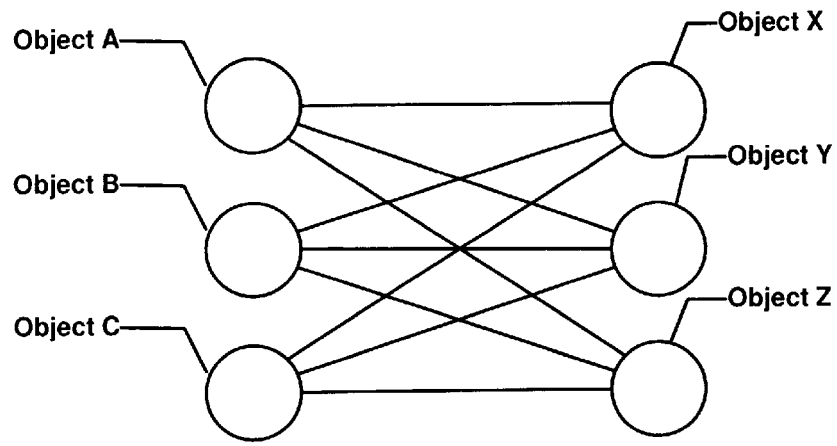

Multiple objects can have a set of relationships between each other. This allows a group of objects to have several interconnections to other members within the same group, as shown in FIG. 1C.

Example—Many to Many

All passengers are related to all other passengers when taking the 9:00 AM train from New York to Philadelphia.

(d) Ordered List

Figure 1D:
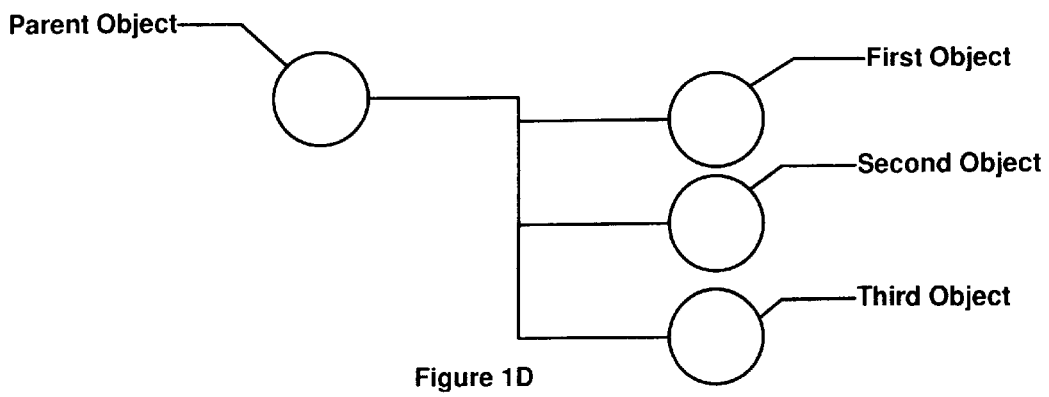

Objects can have an "ordered" relationship between themselves. This relationship may be used to imply the order in which something occurs (like siblings in the order of birth-child #1, child #2, child #3) or to imply a priority (Step #1 occurs prior to Step #2, etc.). A relationship of this type is shown in FIG. 1D.

Example—Ordered List

An example of an ordered list in our Train System is the locomotive (first object) to the caboose (last object) and the cars in between in the sequence in which they are joined. This example is shown in Table 1.

TABLE 1

| | |
|---|---|
| Locomotive | Object #1 |
| Coal Transport Car | Object #2 |
| Passenger Car #1 | Object #3 |
| Passenger Car #2 | Object #4 |
| Lumber Transport Car | Object #5 |
| Caboose | Object #6 |

These structures form the basis for the objects and relationships used to develop more complex models.

C. First Embodiment

Figure 2:
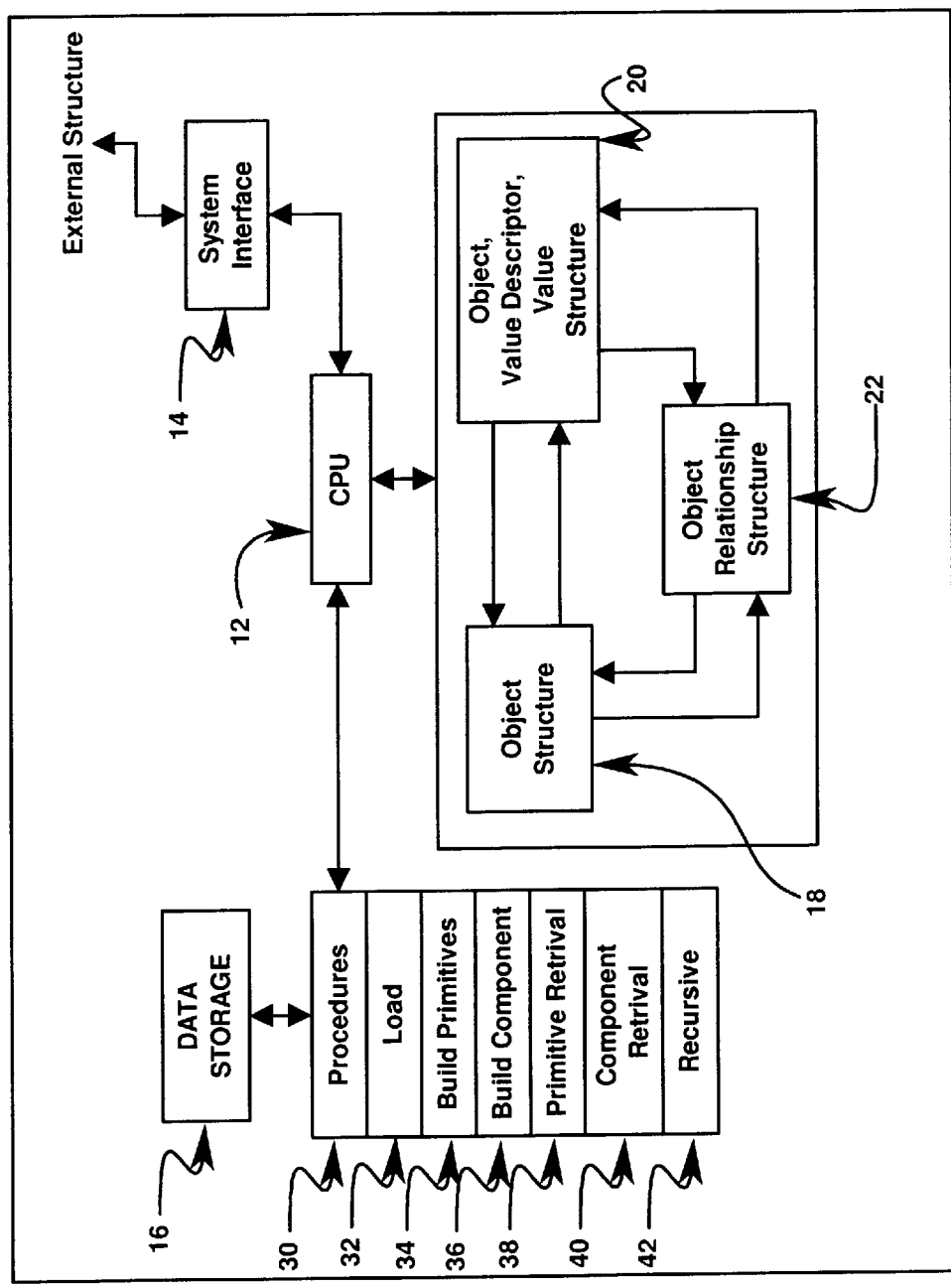
FIG. 2 is a block diagram of a computer according to an embodiment of the invention.

A first embodiment is described with reference to FIGS. 2 through 5. FIG. 2 is a block diagram of a computer 10 according to an embodiment of the invention. A processor (CPU) 12 is coupled to a system interface 14, data storage 16 and program storage 30. The data storage and program storage can reside on any known memory structure such as a disk memory, read only memory, random access memory or other types of memory. The system interface 14 provides for communication between the processor 12 and any external structures such as a user interface or other computers. The data storage 16 includes a plurality of data structure types such as an object data structure type 18, an object relationship data structure type 20 and an object-value descriptor-value data structure type 22. These data structure types are the primitives that serve to define the model.

The procedures in the program memory 30 are also important to defining the model. These procedures include a load procedure 32 for loading the primitives into the data structures. A build primitives procedure 34 is used to construct the low level primitives. A build component procedure 36 is used for assembly of the primitives into higher level components. A set of primitive retrieval procedures 38 is used to retrieve the low level primitives. A set of component retrieval procedures 40 is used to retrieve higher level components based on the information of the low level primitives. A recursive procedure 42 is to iterate across the higher level components to manage virtual models. These procedures serve to provide the functions to build and run the desired virtual model. The procedures further have the ability to manipulate the Meta-language primitives and components within the data structures.

1. The Meta-Language (a) Meta-Language Definitions:

The following primitives form the foundation of this Meta-Language. They are the most basic building blocks of the language and are used to construct higher level components within the language itself. These primitives are assembled with a specific syntax to describe these higher level components, which are then used in "sets" by assembling several components into a group. These sets are used to address specific virtual model definitions within the Meta-Model. The Meta-Language symbols for the primitives are "$\exists$, C, $_o$, $_d$, $_v$, $_r$".

(b) Meta-Language Primitives

The $\exists$ symbol is be used to declare fundamental existence. By combining $\exists$ with one of the subscript symbols, this will be used to declare existence for that type of item. The following list shows the possible subscript items, a detailed description follows within this section of the document for each of the subscript items:

| Item | Subscript |
|---|---|
| object | $\exists_o$ |
| value descriptor | $\exists_d$ |
| value | $\exists_v$ |
| relationship | $\exists_r$ |

Examples of these combinations are as follows. $\exists_o$ is a declaration of a physical object or concept. The term object within the Meta-Language is used in a larger sense than just the meaning of physical objects. Within the language the word "Object" is also used to reference concepts like the ones listed here. As an example the types of physical objects that can be declared are: John Doe; Locomotive #99; or New York. As an example the types of concept objects that could be declared are: Relationship between two cities, New York to Philadelphia; Price of a Train Ticket; and Virtual Model.

$\exists_d$ is a declaration of the existence of a descriptor for a value, which has a label for a value type. As an example the types of descriptor that could be declared are: hair color; weight; dollar amount; and height.

$\exists_v$ is an assignment of a value for a specific combination of $\exists_o$ and $\exists_d$. An $\exists_v$ value can also be a reference to another $\exists_o$ within the system. As an example the types of combinations with values that could be declared are: John Doe, Hair Color, Brown; Locomotive #99, Weight, 85 Tons; and Train Ticket, Dollar Amount, $85.00.

$\exists_r$ is a declaration of a relationship between primitives. This declaration is a grouping of the primitives within a Meta-Model. This grouping is usually an implied relationship managed within the implementation layer of the model.

There is one more primitive used for context. The symbol "C" will be used for the declaration of context. Context is important in a Meta-Language that is used to define Meta-Models, because it defines the circumstances in which information within the system is viewed, analyzed, impacted, or another function performed on it.

There are some basic rules on the use and assembly of these primitives. These rules are explained in detail within this section, and apply to all types of Meta-Language primitives.

Rule 1: C, $\exists_o$, $\exists_d$, $\exists_v$ and $\exists_r$ are the lowest level primitives. In this embodiment, this set of primitives is the complete set of low level primitives.

Rule 2: Any item or declaration that is not a value is an object by default (i.e. process, action, concept, physical things, locations, etc.). All are of the primitive "object" type.

Rule 3: Values cannot be directly related to other values (values must always be associated to an object). A value that needs to be related to another value must be related to an Object, and then the objects can be related to each other.

Rule 4: Data structures $M_o$, $M_v$, $M_r$ and $M_{rv}$ are the compound definitions based on the lower level primitives except for $M_o$. These symbols are described below. While these data structures provide a basic set of data structures to describe the invention, additional data structures can be constructed with the Meta-Language primitives.

2. Meta-Models

With the defined primitives, a meta-model is constructed according to rules that define the respective model data structures. Higher level components will be indicated with an "M", which stands for a model, comprised of the lower level primitives. These M subscript models are managed within the implementation layer of a Meta-Model at a very low management level. These models are assembled from the low level primitives list above. The exemplary meta-model includes three data structure types. The first represents a value of an object, and is called an $M_v$. The second represents a relationship between objects, and is called an $M_r$. The third represents a relationship between objects and also a value, and is called an $M_{rv}$. Using these three data structure types virtual models can be generated.

(a) Object, $M_o$

Figure 3:
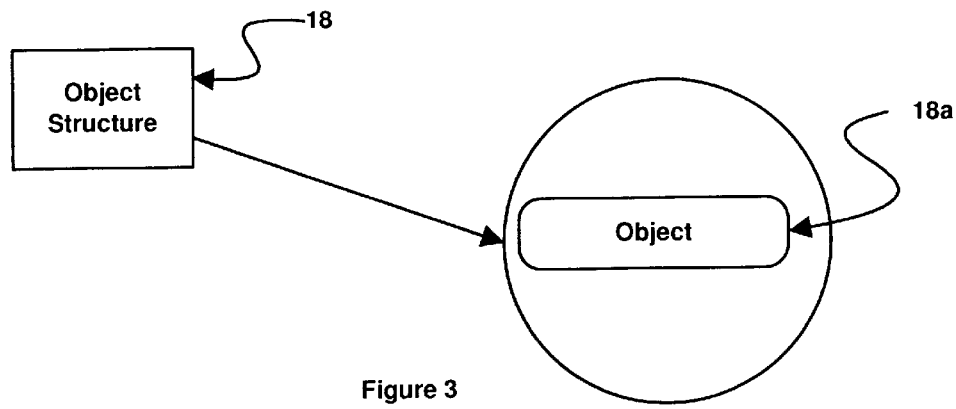
FIG. 3 depicts an object structure type according to an embodiment of the invention.

An $M_o$ is an example of a component that is used to declare and describe an object. FIG. 3 depicts the object descriptor structure type 18 according to an embodiment of the invention. The object data structure includes a structure containing an object 18a. The definition of $M_o$ is ($[\exists_o]$). This is explained as $\exists_o$ represents the existence of an object.

(b) Value, $M_v$

Figure 4:
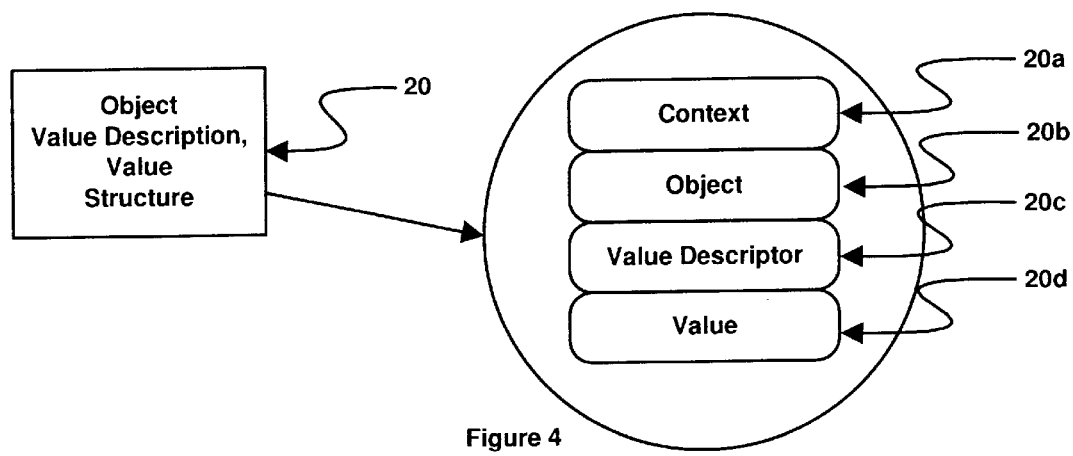
FIG. 4 depicts a value data structure type according to an embodiment of the invention.

An $M_v$ is an example of a higher level component that is assembled from the lower level primitives and is used to describe a value attached to an object. FIG. 4 depicts the object-value descriptor-value structure type 20 according to an embodiment of the invention. The object data structure includes a structure containing a context 20a and an object 20b. The definition of $M_v$ is ($[C, \exists_o, \exists_d, \exists_v]\exists_r$). These are explained as C represents context, $\exists_o$ represents the existence of an object, $\exists_d$ represents the existence of a value descriptor, $\exists_v$ represents the existence of a value, and $\exists_r$ represents an imposed relationship between the components C, $\exists_o$, $\exists_d$, $\exists_v$ of the data structure.

The listed primitives will be used as input parameters to this component with the imposed relationship. When defining virtual models, the symbol $M_v$ is used instead of referring to the primitives that constitute the structure, thereby permitting the shortening of definitions and easier management.

To retrieve an object value ($M_v$), the retrieval requires identification of the primitives C, $\exists_o$ and $\exists_d$ to identify the specific value. To perform this procedure, the inputs are (C, $\exists_o$, $\exists_d$) and the output is $\exists_v$.

(c) Relationship, $M_r$

Figure 5:
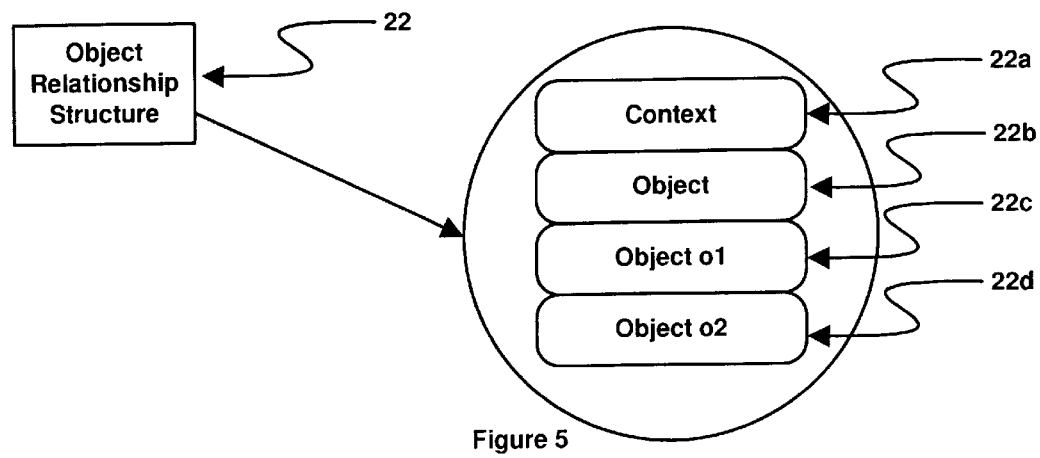
FIG. 5 depicts a relationship data structure type according to an embodiment of the invention.

An $M_r$ is an example of a higher level component that is assembled from the lower level primitives and is used to describe a relationship between objects. FIG. 5 depicts a relationship data object according to an embodiment of the invention. The relationship data object includes a structure containing a context 22a, object 22b, object 1 22c and object 2 22d. The definition of $M_r$ is ($[C, \exists_o, \exists_{o1}, \exists_{o2}]\exists_r$). These are explained as C represents context, $\exists_o$ represents the existence of an object which is the object identifier for the relationship, $\exists_{o1}$ represents the existence of a second object, $\exists_{o2}$ represents the existence of a third object, and $\exists_r$ represents the application of a relationship between the three objects and context of the data structure.

To retrieve a relationship between objects $M_r$, the retrieval requires identification of the primitives C and $\exists_o$ to identify the context and object. To perform this procedure, the inputs are (C, $\exists_o$) and the output is ($\exists_{o1}$, $\exists_{o2}$).

(d) Relationship and Value, $M_{rv}$

Figure 6:
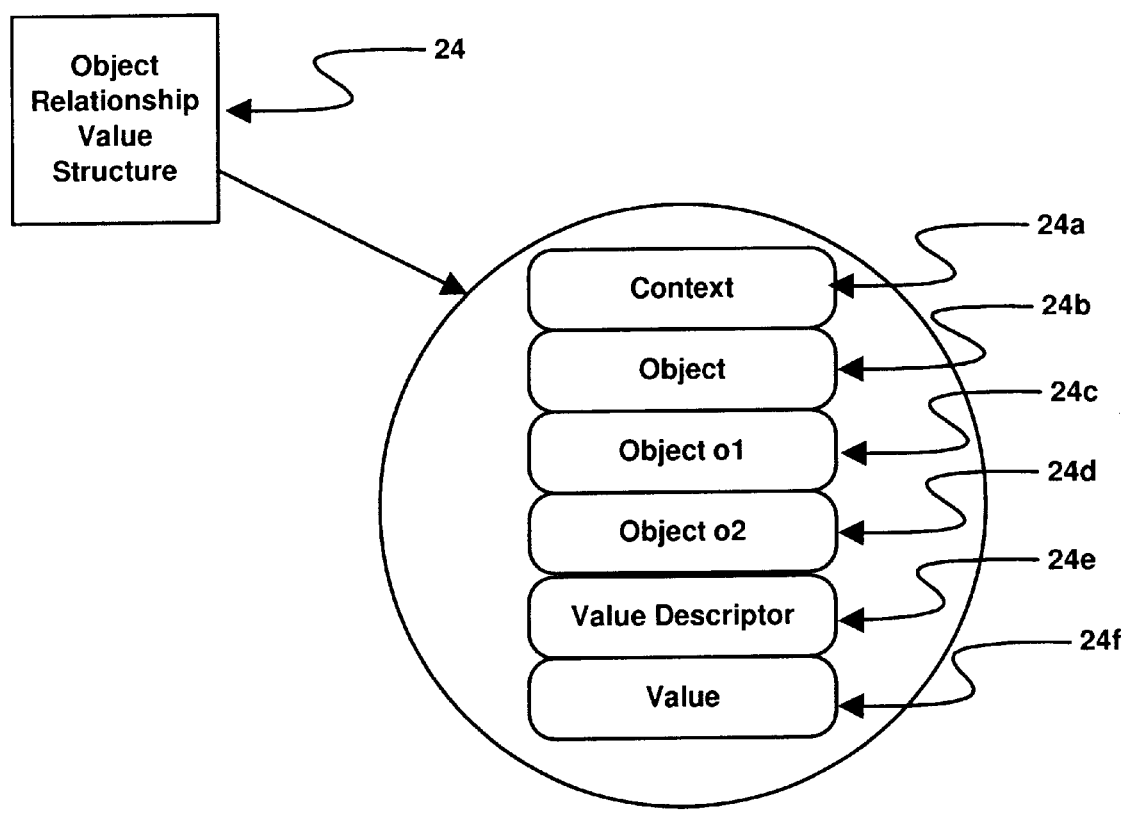
FIG. 6 depicts a relationship-value data structure type according to an embodiment of the invention.

An $M_{rv}$ is an example of a higher level component that is assembled from the lower level primitives and is used to describe a relationship between objects including a value. By combining an $M_r$ and $M_v$, which is expressed as $M_{rv}$, compound definitions can be formed to define more complex components. FIG. 6 depicts a relationship-value data object according to an embodiment of the invention. The relationship-value data object includes a structure containing a context 24a, object 24b, object 1 24c, object 2 24d, value descriptor 24e and value 24f. The definition of $M_{rv}$ is ($[C, \exists_o\ (\exists_{o1}, \exists_{o2})\ (\exists_d, \exists_v)]\exists_r$), or $[M_r, M_v]$. These are explained as C represents context, $\exists_o$ represents the existence of an object which is the object identifier for the relationship, $\exists_{o1}$ represents the existence of a second object, $\exists_{o2}$ represents the existence of a third object, $\exists_d$ represents the existence of a value descriptor, $\exists_v$ represents the existence of a value and $\exists_r$ represents the application of a relationship between the three objects, value descriptor, value and context of the data structure.

D. Train Example

Figure 7:
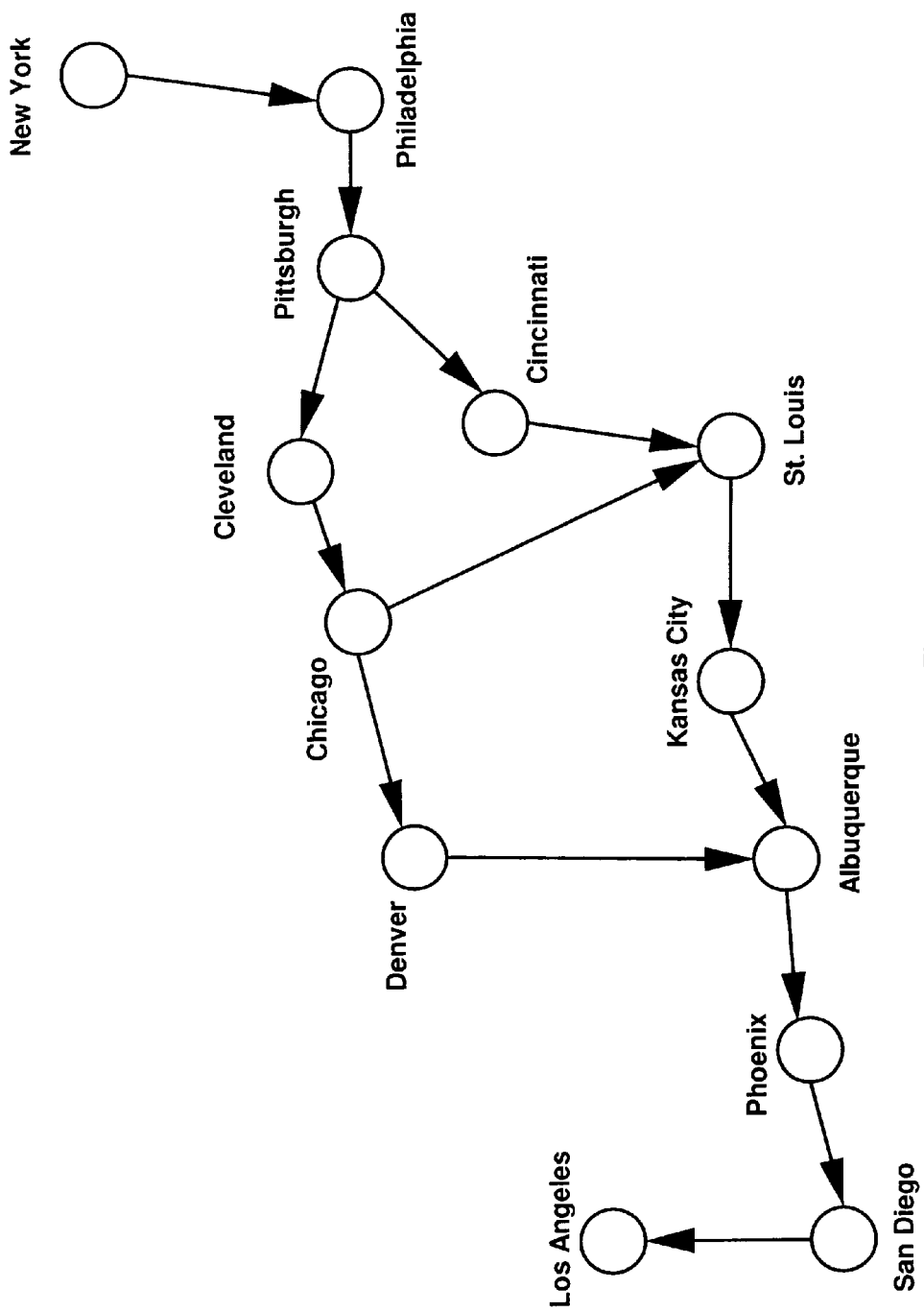
FIG. 7 illustrates a train network example.

The following is an example of a Meta-Model describing a train system that would define and allow a train to travel from New York to Los Angeles according to FIG. 7. The worksheets below define the Meta-Model information and components that are subsequently assembled into the Meta-Model to build the virtual train model. To begin, some basic examples of $M_v$ and $M_r$ are defined to see how small sub-models are defined within a Meta-Model.

A basic example of $Mv=([C, \exists_o, \exists_d, \exists_v]\exists_r)$

This example shows the primitives for two structures ($M_v$) to define two ticket prices for a First Class Passenger and for Economy Class Passenger.

TABLE 2

| M-Type: $M_v$ | Context (C) | Object ($\exists_o$) | Value Descriptor ($\exists_d$) | Value ($\exists_v$) |
|---|---|---|---|---|
| $M_v$ | Ticketing | First Class Ticket | Ticket Price | 125 |
| $M_v$ | Ticketing | Economy Class Ticket | Ticket Price | 85 |

A basic example of $M_r=([C, \exists_o, \exists_{o1}, \exists_{o2}]\exists_r)$

This example shows the primitives for two components ($M_r$) that define two relationships between train stations. The first $M_r$ defines the relationship between New York and Philadelphia the second $M_r$ defines the relationship between Philadelphia and Pittsburgh. Note that the first "Object" ($\exists_o$) for each $M_r$ is an arbitrary description that is unique within the system with the same context. This description can be used to retrieve the object $\exists_{o1}$ and related $\exists_{o2}$.

TABLE 3

| M-Type: | Context (C) | Object ($\exists_o$) | Object ($\exists_{o1}$) | Object ($\exists_{o2}$) |
|---|---|---|---|---|
| $M_r$ | Train | Train Network | Station #1 | Station #2 |
| $M_r$ | Train | Train Network | Station #2 | Station #3 |

A basic example of $M_{rv}=([C, \exists_o\ (\exists_{o1}, \exists_{o2})\ (\exists_d, \exists_v)]\exists_r)$ This example shows the primitives for a component ($M_{rv}$) that defines the relationship between train stations and the distance between the stations in miles.

TABLE 4

| M-Type: | Context | Object ($\exists_o$) | Object ($\exists_{o1}$) | Object ($\exists_{o2}$) | Value Descriptor ($\exists_d$) | Value ($\exists_v$) |
|---|---|---|---|---|---|---|
| $M_{rv}$ | Train | Train Network | Station #1 | Station #2 | distance in miles | 90 |

An Evaluator Example:

Within a Meta-Model several small virtual models can be defined. By combining several $M_v$ and $M_r$'s, an evaluator can be assembled to do evaluations. An evaluator is constructed by defining all of the components needed to do the math. These are the components of the equation like the operator and the items that need to be compared.

The following example is a basic evaluator used to determine whether a passenger can afford to take a trip from New York to Philadelphia based on their current checking account balance. The $M_r$ defines the Object to the left of the "Operator", the Operator, the Object to the right of the Operator and the values for the left and right Objects. By defining the items to the left and right of the Operator as references to other Objects the process of the evaluation can become generic and the values of the objects can be used or changed by other actions within the same Meta-Model.

TABLE 5

| Step | M-type | (C) | $\exists_o$ | $\exists_d$ | $\exists_r$ |
|---|---|---|---|---|---|
| 1 | $M_r$ | Evaluator | checking | evaluator | my checking account |
| 2 | $M_v$ | Evaluator | checking | operator | |
| 3 | $M_r$ | Evaluator | checking | evaluator | cost of a ticket to Philly |
| 4 | $M_v$ | Evaluator | my checking account | evaluator | $100 |
| 5 | $M_r$ | Evaluator | cost of a ticket Philly | evaluator | $85 |

To process an evaluator like the one described above we need to retrieve the details of the evaluator. The steps listed in Table 6 shows the actions of retrieving each $M_v$ to construct the math equation. Shown in the "Result" column is the math equation as each step is processed to build up the equation.

TABLE 6

| Symbol | Description of Step | Result |
|---|---|---|
| $M_r$ | Retrieve and insert "Evaluator Object" | My checking account |
| $M_v$ | Locate the Operator | Greater than or equal to |
| $M_r$ | Retrieve and insert "Evaluator Object" | Cost of the ticket to Philly |
| $M_v$ | Retrieve left value based on left object | $100 |
| $M_v$ | Retrieve right value based on right object | $85 |

The results of the retrieval and replacement of the left and right "Evaluator Objects" the formula $100 \geq $85 is assembled. By performing the math, the passenger can afford to take a trip from New York to Philadelphia.

D. Second Embodiment

Figure 8:
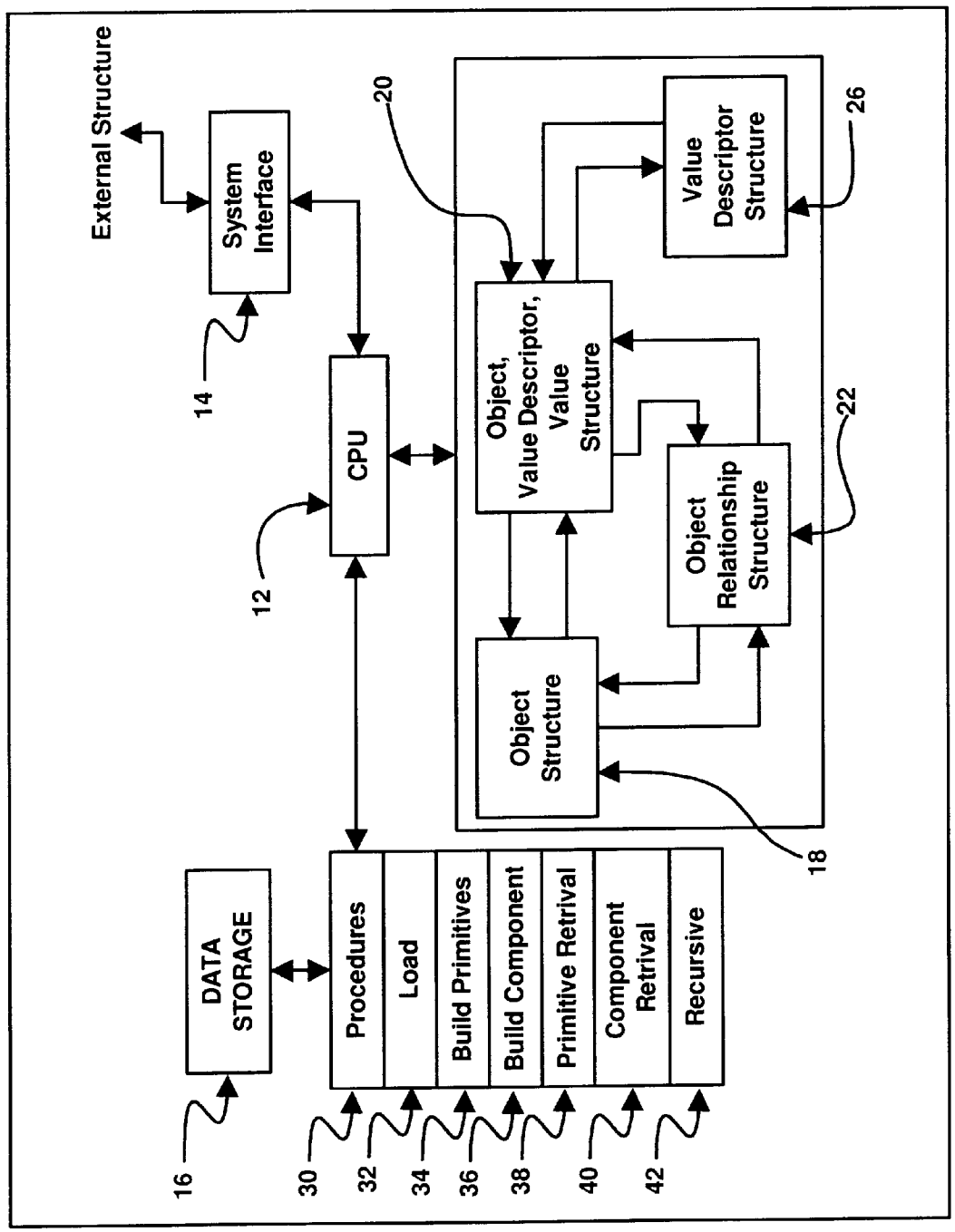
FIG. 8 is a block diagram of a computer according to another embodiment of the invention.
Figure 9:
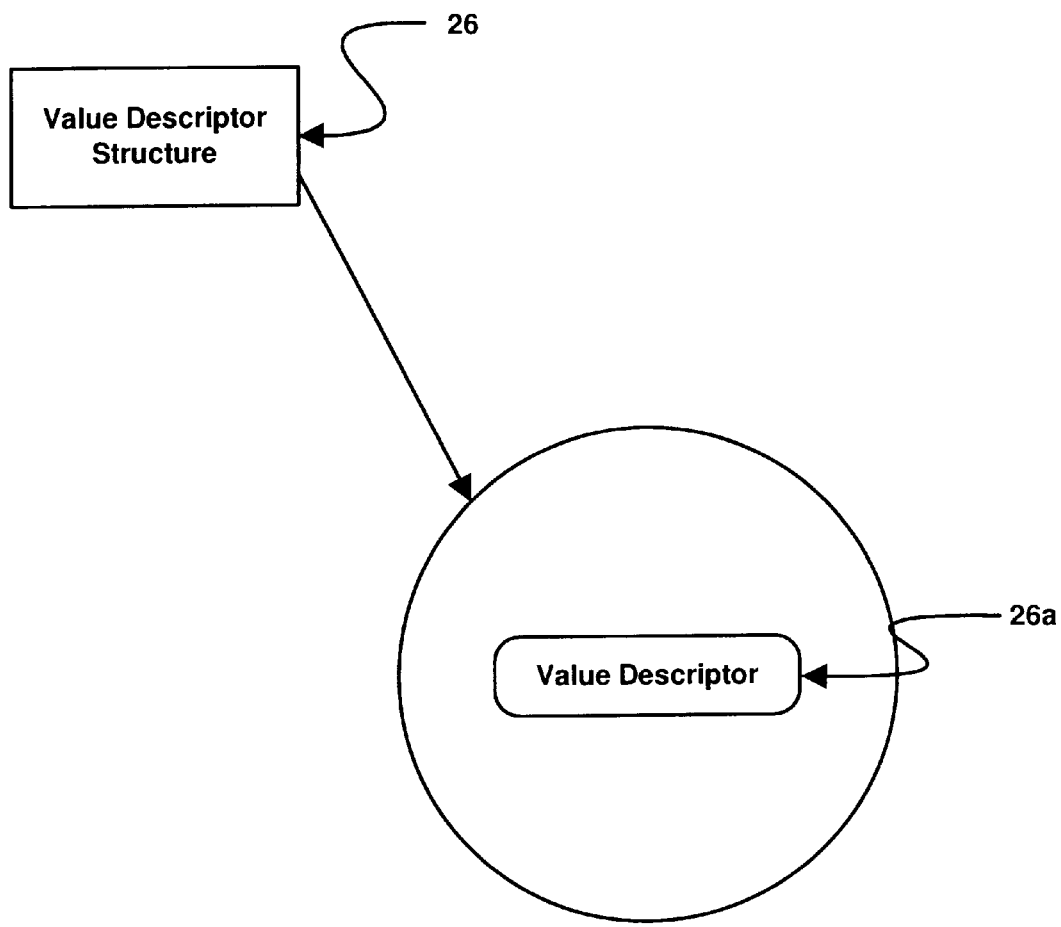
FIG. 9 is a block diagram of a value descriptor data structure type according to an embodiment of the invention.

FIG. 8 is a block diagram of a computer according to a second embodiment of the invention. The second embodiment employs many of the same components as the figure embodiment and those components are commonly numbered. The primary difference is the addition of a value-descriptor structure 26 ($M_d$). This additional structure explicitly delineates the value-descriptors $\exists_d$ that are referenced within the object-value descriptor-value structure. The definition of $M_d$ is ($[\exists_d]$). These are explained as $\exists_d$ represents the existence of a value descriptor. The value-descriptor data structure type 26 ($M_d$) is similar to the object data structure type 18 ($M_o$) in the first embodiment but instead of an object, the structure contains a value descriptor. This structure is used to contain the value descriptors for the second embodiment versus the object structure 18 that stores both the value descriptors and all objects. The addition of the value-descriptor structure can provide in some cases, an increase in performance and reduction the number of abstractions that are required to implement the model.

CONCLUSION

Advantages of the invention include the ability to characterize information and data types in a minimal set of contents to model various more complex systems.

Having disclosed exemplary embodiments and the best mode, modifications and variations may be made to the exemplary embodiments while remaining within the scope of the invention as defined by the following claims.

What is claimed is:

1. A computer for storing, manipulating and retrieving data structures, comprising:

a memory configured to store a plurality of data in a plurality of data structure types including a first data structure type, a second data structure type and a relationship data structure type, at least one of said data structure types including a context;

an interface configured to receive instructions and calls from an external structure and to respond to said instructions and said calls;

a processor coupled to said memory and said interface circuit and configured to receive said instructions and to associate information in said instructions with said first data structure type, said second data structure type and said relationship data structure type, said instruction including information to store in said relationship data structure type that relates one or more of said first data structure type and said second data structure type, and configured to receive said calls and to manipulate said first data structure type, said second data structure type and said relationship data structure type according to said call, to retrieve a data structure type based on said call and to provide information in said first data structure type as a call response.

2. The computer of claim 1, wherein:

said first data structure type is a declarative data structure including an object;

said second data structure type is a value data structure including a context, object, value descriptor and value;

said relationship data structure type includes a context, a first object, a second object and a third object to identify a relationship between said context and said first object, said second object and said third object; and said computer further comprises a composite data structure type including a context, a first object, a second object, a third object, a value descriptor and a value.

3. The computer of claim 1, wherein:

said first data structure type is a declarative data structure consisting of an object;

said second data structure type is a value data structure consisting of a context, object, value descriptor and value;

said relationship data structure type consists of a context, a first object, a second object and a third object to identify a relationship between said context and said first object, said second object and said third object; and said computer further comprises a composite data structure type consisting of a context, a first object, a second object, a third object, a value descriptor and a value.

4. The computer of claim 1, further comprising:

an evaluator configured to manipulate said first data structure type, said second data structure type and said relationship data structure type and to provide information to respond to said call.

5. The computer of claim 2, further comprising:

an evaluator configured to manipulate said first data structure type, said second data structure type and said relationship data structure type and to generate at least one evaluator object type.

6. The computer of claim 4, wherein:

said evaluator is configured to modify at least one if said first data structure type, said second data structure type and said relationship data structure type in response to said call.

7. The computer of claim 5, wherein:

said evaluator is configured to modify at least one if said first data structure type, said second data structure type and said relationship data structure type in response to said call.

8. A structure for use with a computer system having a processor, a memory and a user interface, said structure comprising:

a plurality of data structures including a first data structure type, a second data structure type and a relationship data structure type, at least one of said data structure types including a context;

an instruction interface configured to receive instructions from said user interface and to respond to said instructions;

a call interface configured to receive calls from other structures and to respond to said calls; and an execution procedure configured to receive said instructions and to associate information in said instructions with said first data structure type, said second data structure type and said relationship data structure type, said instruction including information to store in said relationship data structure type that relates one or more of said first data structure type and said second data structure type, and configured to receive said calls and to manipulate said first data structure type, said second data structure type and said relationship data structure type according to said call, to retrieve a data structure type based on said call and to provide information in said first data structure type as a call response.

9. The structure of claim 8, wherein:

said first data structure type is a declarative data structure including an object;

said second data structure type is a value data structure including a context, object, value descriptor and value;

said relationship data structure type includes a context, a first object, a second object and a third object to identify a relationship between said context and said first object, said second object and said third object; and said computer further comprises a composite data structure type including a context, a first object, a second object, a third object, a value descriptor and a value.

10. The structure of claim 8, wherein:

said first data structure type is a declarative data structure consisting of an object;

said second data structure type is a value data structure consisting of a context, object, value descriptor and value;

said relationship data structure type consists of a context, a first object, a second object and a third object to identify a relationship between said context and said first object, said second object and said third object; and said computer further comprises a composite data structure type consisting of a context, a first object, a second object, a third object, a value descriptor and a value.

11. The structure of claim 8, further comprising:

an evaluator procedure configured to manipulate said first data structure type, said second data structure type and said relationship data structure type and to provide information to respond to said call.

12. The structure of claim 9, further comprising:

an evaluator procedure configured to manipulate said first data structure type, said second data structure type and said relationship data structure type and to generate at least one evaluator object type.

13. The structure of claim 11, wherein:

said evaluator procedure is configured to modify at least one if said first data structure type, said second data structure type and said relationship data structure type in response to said call.

14. The structure of claim 12, wherein:

said evaluator procedure is configured to modify at least one if said first data structure type, said second data structure type and said relationship data structure type in response to said call.

15. A method of storing, manipulating and retrieving data structures, comprising the steps of:

storing a plurality of data structures including a first data structure type, a second data structure type and a relationship data structure type, at least one of said data structure types including a context;

receiving instructions from an external structure and responding to the instructions;

receiving calls from an external structure and responding to the calls;

associating information in the instructions with the first data structure type, the second data structure type and the relationship data structure type, the instruction including information to store in the relationship data structure type that relates one or more of the first data structure type and the second data structure type; and manipulating the first data structure type, the second data structure type and the relationship data structure type according to the call, to retrieve a data structure type based on the call and to provide information in the first data structure type as a call response.

16. The method of claim 15, wherein:

said storing step includes the steps of storing the plurality of data structures where the first data structure type is a declarative data structure including an object;

said storing step includes the steps of storing the plurality of data structures where the second data structure type is a value data structure including a context, object, value descriptor and value;

said storing step includes the steps of storing the plurality of data structures where the relationship data structure type includes a context, a first object, a second object and a third object to identify a relationship between the context and the first object, the second object and the third object; and said storing step includes the steps of storing a composite data structure type including a context, a first object, a second object, a third object, a value descriptor and a value.

17. The method of claim 15, wherein:

said storing step includes the steps of storing the plurality of data structures where the first data structure type is a declarative data structure consisting of an object;

said storing step includes the steps of storing the plurality of data structures where the second data structure type is a value data structure consisting of a context, object, value descriptor and value;

said storing step includes the steps of storing the plurality of data structures where the relationship data structure type consists of a context, a first object, a second object and a third object to identify a relationship between the context and the first object, the second object and the third object; and said storing step includes the steps of storing a composite data structure type consisting of a context, a first object, a second object, a third object, a value descriptor and a value.

18. The method of claim 15, further comprising the step of:

evaluating the calls and manipulating the first data structure type, the second data structure type and the relationship data structure type and providing information to respond to the call.

19. The method of claim 16, further comprising the step of:

evaluating the calls and manipulating the first data structure type, the second data structure type and the relationship data structure type and providing information to respond to the call.

20. The method of claim 18, wherein:

said evaluating step includes to step of modifying at least one if the first data structure type, the second data structure type and the relationship data structure type in response to the call.

21. The method of claim 19, wherein:

said evaluating step includes to step of modifying at least one if the first data structure type, the second data structure type and the relationship data structure type in response to the call.

* * * * *